US008952423B2

(12) United States Patent
Jeon et al.

(10) Patent No.: US 8,952,423 B2
(45) Date of Patent: Feb. 10, 2015

(54) SEMICONDUCTOR DEVICE HAVING DECOUPLING CAPACITORS AND DUMMY TRANSISTORS

(71) Applicant: Samsung Electronics Co., Ltd., Gyeonggi-do (KR)

(72) Inventors: Joong-Won Jeon, Seoul (KR); Hee-Sung Kang, Seongnam-si (KR); Dae-Ho Yoon, Anyang-si (KR); Dal-Hee Lee, Seoul (KR); Suk-Joo Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/785,156

(22) Filed: Mar. 5, 2013

(65) Prior Publication Data
US 2013/0320405 A1   Dec. 5, 2013

(30) Foreign Application Priority Data

Jun. 4, 2012   (KR) .................. 10-2012-0060049

(51) Int. Cl.
   *H01L 27/02*   (2006.01)
   *H01L 29/94*   (2006.01)
(52) U.S. Cl.
   CPC ............ *H01L 27/0207* (2013.01); *H01L 29/94* (2013.01)
   USPC ...... 257/204; 257/E27.06; 257/202; 257/208; 257/369; 257/206; 257/401

(58) Field of Classification Search
   CPC ............ H01L 2924/00; H01L 27/0207; H01L 27/092; H01L 27/11803; G06F 17/5077; G06F 17/5068
   USPC ............. 257/E27.06, 202, 208, 369, 206, 401
   See application file for complete search history.

(56) References Cited

U.S. PATENT DOCUMENTS

| 6,396,123 | B1 | 5/2002 | Nagaoka |
| 6,504,192 | B2 | 1/2003 | Hasunuma |
| 7,456,446 | B2 | 11/2008 | Tahira et al. |
| 7,671,469 | B2 | 3/2010 | Lee et al. |
| 7,971,158 | B2 | 6/2011 | Anderson et al. |
| 2004/0213029 | A1* | 10/2004 | Hirata et al. ................ 365/104 |
| 2005/0116268 | A1* | 6/2005 | Tahira et al. ................ 257/288 |
| 2007/0174802 | A1 | 7/2007 | Shin et al. |
| 2010/0006896 | A1* | 1/2010 | Uemura ....................... 257/202 |
| 2010/0044755 | A1* | 2/2010 | Tsuda et al. ................. 257/206 |
| 2011/0057685 | A1* | 3/2011 | Noguchi ...................... 326/103 |
| 2011/0101433 | A1* | 5/2011 | Kim ............................. 257/296 |
| 2013/0320405 | A1 | 12/2013 | JEON et al. |

FOREIGN PATENT DOCUMENTS

| KR | 10-2004-0008504 A | 1/2004 |
| KR | 10-2006-0009419 A | 1/2006 |
| KR | 10-2007-0078566 A | 8/2007 |
| KR | 10-2008-0062727 A | 7/2008 |
| KR | 10-2010-0025684 A | 3/2010 |
| KR | 10-2013-0136329 A | 12/2013 |

* cited by examiner

*Primary Examiner* — David Vu
*Assistant Examiner* — Jonathan Han
(74) *Attorney, Agent, or Firm* — Lee & Morse, P.C.

(57) ABSTRACT

A semiconductor device includes a logic region disposed in a central region of the semiconductor device, and a peripheral region disposed in an outer region thereof. The logic region includes a line-shaped logic transistor and a box-shaped decoupling capacitor. The peripheral region includes a line-shaped peripheral transistor and a line-shaped peripheral dummy transistor disposed adjacent to the peripheral transistor.

15 Claims, 10 Drawing Sheets

SEMICONDUCTOR DEVICE HAVING DECOUPLING CAPACITORS AND DUMMY TRANSISTORS

CROSS-REFERENCE TO RELATED APPLICATION

The present application claims priority under 35 U.S.C. §119 to Korean Patent Application No. 10-2012-0060049, filed on Jun. 4, 2012, in the Korean Intellectual Property Office, and entitled: "Semiconductor Device Having Decoupling Capacitors and Dummy Transistors," which is incorporated by reference herein in its entirety.

BACKGROUND

Embodiments relate to a semiconductor having a logic transistor and a peripheral transistor.

SUMMARY

Embodiments are directed to a semiconductor device including a logic region disposed in a central region of the semiconductor device and a peripheral region disposed in an outer region of the semiconductor device. The logic region includes a line-shaped logic transistor, and a box-shaped decoupling capacitor. The peripheral region includes a line-shaped peripheral transistor and a line-shaped peripheral dummy transistor disposed adjacent to the peripheral transistor.

The line-shaped logic transistor may have a logic transistor gate electrode having a first width. The box-shaped decoupling capacitor may have a capacitor electrode having a second width, the second width being at least ten times greater than the first width.

The line-shaped peripheral transistor may have a peripheral transistor gate electrode having a third width, the third width being at least five times greater than the first width and less than the second width.

The line-shaped peripheral dummy transistor may have a peripheral dummy transistor gate electrode having a fourth width, the fourth width being less than the third width.

A length of the peripheral dummy transistor gate electrode of the line-shaped peripheral dummy transistor may be at least five times greater than the fourth width.

The logic transistor gate electrode of the line-shaped logic transistor may have a first length. The capacitor electrode of the box-shaped decoupling capacitor may have a second length less than the first length.

A length of the capacitor electrode of the box-shaped decoupling capacitor may be less than twice the second width thereof.

The logic region may further include logic dummy transistors disposed parallel to the line-shaped logic transistor and adjacent to the line-shaped logic transistor. The logic dummy transistors may have a width that is equal to or less than the first width of the line-shaped logic transistor.

Embodiments are also directed to a semiconductor device including a logic region and a peripheral region. The logic region includes a plurality of logic transistors parallel to one another, the logic transistors each having a first width in a horizontal direction, and a plurality of decoupling capacitors disposed in a row, the decoupling capacitors each having a second width in the horizontal direction, the second width being at least five times greater than the first width. The peripheral region includes a plurality of peripheral transistors parallel to one another, the peripheral transistors each having a third width in the horizontal direction, the third width being greater than the first width and less than the second width, and a plurality of peripheral dummy transistors parallel to one another, the peripheral dummy transistors each having a fourth width in the horizontal direction, the fourth width being less than the third width.

Each of the logic transistors may include a logic active region in a substrate, a logic transistor gate insulating layer and a logic transistor gate electrode stacked on the logic active region, inner logic transistor spacers on side surfaces of the logic transistor gate insulating layer and the logic transistor gate electrode, the inner logic transistor spacers including silicon oxide, and outer logic transistor spacers on side surfaces of the inner logic transistor spacers, the outer logic transistor spacers including silicon nitride. The inner logic transistor spacers may include lower end portions extending onto a top surface of the substrate. The outer logic transistor spacers may be on the lower end portions of the inner logic transistor spacers. Outer side surfaces of the lower end portions of the inner logic transistor spacers may be vertically aligned with outer side surfaces of the outer logic transistor spacers.

Each of the decoupling capacitors may include a capacitor active region in the substrate, the capacitor active region being isolated from the logic active region, a capacitor dielectric layer and a capacitor electrode on the substrate, the capacitor dielectric layer and the capacitor electrode being configured to overlap the capacitor active region, inner capacitor spacers on side surfaces of the capacitor dielectric layer and the capacitor electrode, the inner capacitor spacers including silicon oxide, and outer capacitor spacers on side surfaces of the inner capacitor spacers, the outer capacitor spacers including silicon nitride. The inner capacitor spacers may include lower end portions extending onto a top surface of the substrate. The outer capacitor spacers may be on the lower end portions of the inner capacitor spacers. Outer side surfaces of the lower end portions of the inner capacitor spacers may be vertically aligned with outer side surfaces of the outer capacitor spacers.

Top end portions of the inner capacitor spacers may be at a lower level than a top end portion of the capacitor electrode. Top end portions of the outer capacitor spacers may be at a lower level than the top end portion of the capacitor electrode.

Each of the peripheral transistors may include a peripheral active region in the substrate, a peripheral transistor gate insulating layer and a peripheral transistor gate electrode stacked on the peripheral active region, inner peripheral transistor spacers on side surfaces of the peripheral transistor gate insulating layer and the peripheral transistor gate electrode, the inner peripheral transistor spacers including silicon oxide, and outer peripheral transistor spacers on side surfaces of the inner peripheral transistor spacers, the outer peripheral transistor spacers including silicon nitride. The inner peripheral transistor spacers may have lower end portions extending onto the top surface of the substrate. The outer peripheral transistor spacers may be on the lower end portions of the inner peripheral transistor spacers. Outer side surfaces of the lower end portions of the inner peripheral transistor spacers may be vertically aligned with outer side surfaces of the outer peripheral transistor spacers.

Each of the peripheral dummy transistors may include a peripheral dummy active region in the substrate and connected to the peripheral active region, a peripheral dummy transistor gate insulating layer and a peripheral dummy transistor gate electrode stacked on the dummy peripheral active region, inner peripheral dummy transistor spacers on side surfaces of the peripheral dummy transistor gate insulating layer and the peripheral dummy transistor gate electrode, the inner peripheral dummy transistor spacers having lower end portions extending onto a top surface of the substrate, and outer peripheral dummy transistor spacers on side surfaces of the lower end portions of the inner peripheral dummy transistor spacers. Outer side surfaces of the lower end portions of the inner peripheral dummy transistor spacers may be vertically aligned with outer side surfaces of the outer peripheral dummy transistor spacers.

Each of the peripheral dummy transistors may further includes a low-concentration peripheral dummy transistor doping region vertically aligned with the side surfaces of the peripheral dummy transistor gate electrode, the low-concentration peripheral dummy transistor doping region having a first depth, and a high-concentration peripheral dummy transistor doping region vertically aligned with the outer side surfaces of the outer peripheral dummy transistor spacers, the high-concentration peripheral dummy transistor doping region having a second depth greater than the first depth.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1A:
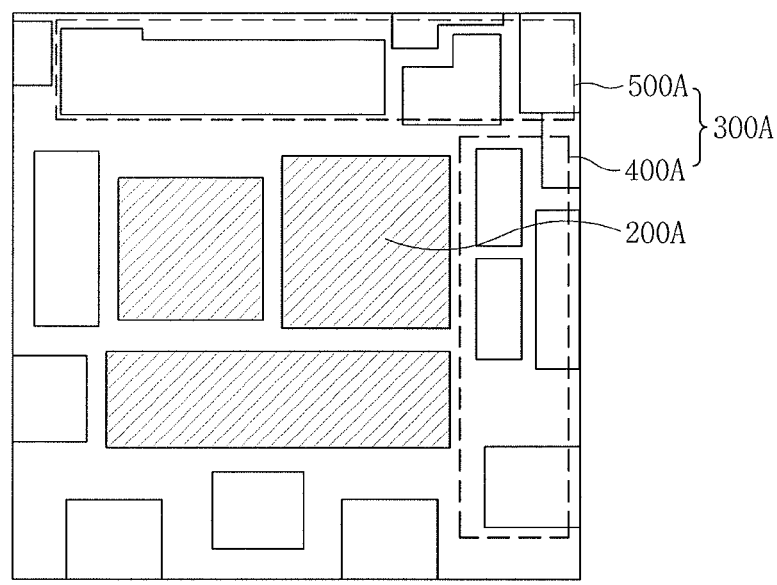
FIGS. 1A and 1B illustrate schematic layouts of semiconductor devices according to embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

The terminology used herein to describe embodiments is not intended to limit the scope thereof. The articles "a," "an," and "the" are singular in that they have a single referent, however the use of the singular form in the present document should not preclude the presence of more than one referent. In other words, elements referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

Spatially relative terms, such as "below", "beneath", "lower", "above", "upper", "lower" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of lower and upper. The device may be otherwise oriented (rotated 90 degrees or at other orientations) and the spatially relative descriptors used herein interpreted accordingly.

Embodiments are described herein with reference to cross-section and plan illustrations that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope.

Like numbers refer to like elements throughout. Thus, the same or similar numbers may be described with reference to other drawings even if they are neither mentioned nor described in the corresponding drawing. Also, even elements that are not denoted by reference numbers may be described with reference to other drawings.

In the present specification, a line shape may be interpreted as a shape having a long side that is at least about five times longer than a short side thereof, and a box shape may be interpreted as a shape having a long side that is substantially equal to a short side thereof or less than five times longer than the short side thereof. The line shape may be interpreted as a bar shape or a stick shape, while the box shape may be interpreted as a square shape or a rectangular shape. Accordingly, each of the line shape, the bar shape, and the stick shape may indicate that a long side is sufficiently longer than a short side, and each of the box shape, the square shape, or the rectangular shape may indicate that a long side is equal to a short side, or less than several times longer than the short side.

In the present specification, from layouts and top views, widths may be defined as distances or sizes measured in a horizontal direction, and lengths may be defined as distances or sizes measured in a vertical direction. Thus, the widths and lengths may be numerical values defined in directions crossing at right angles.

In the present specification, the expression "substantially equal or the same" may indicate that an error between two components is 5% or less of an ideal value of each component. Typically, even if a semiconductor device is manufactured using a good semiconductor manufacturing process, components may not be formed to ideal sizes but may have slight errors. When an error rate is about 5% or less, two components may be regarded as substantially the same components.

Figure 1B:
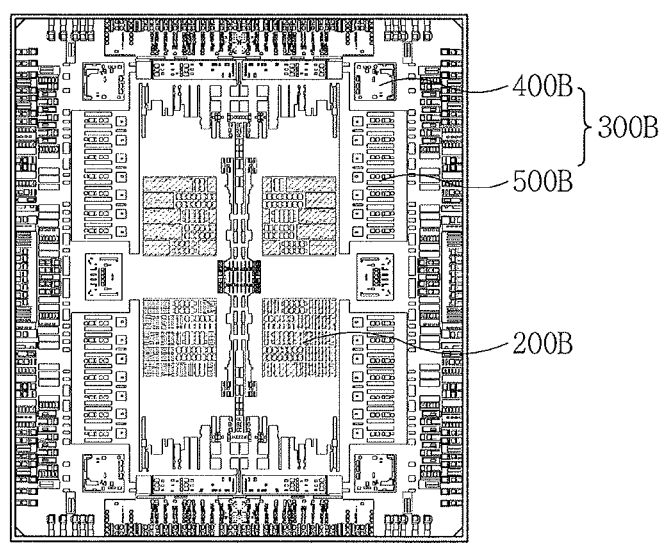

FIGS. 1A and 1B illustrate schematic layouts of semiconductor devices 10A and 10B according to embodiments. Referring to FIGS. 1A and 1B, the semiconductor devices 10A and 10B according to the embodiments may include logic regions 200A and 200B and peripheral regions 300A and 300B, respectively. The peripheral regions 300A and 300B may include analog core regions 400A and 400B and/or input/output (I/O) circuit regions 500A and 500B, respectively. For example, the logic regions 200A and 200B may be disposed in central regions of the semiconductor devices 10A and 10B, respectively, and the analog core regions 400A and 400B and the I/O circuit regions 500A and 500B may be disposed in outer regions of the semiconductor devices 10A and 10B, respectively. The logic regions 200A and 200B, the analog core regions 400A and 400B, and the I/O circuit regions 500A and 500B may be disposed in various positions in various shapes according to the kinds of the semiconductor devices 10A and 10B. For instance, portions of the logic regions 200A and 200B may be disposed in the outer regions of the semiconductor devices 10A and 10B, respectively. Portions of the analog core regions 400A and 400B and portions of the I/O circuit regions 500A and 500B may be disposed in the central regions of the semiconductor devices 10A and 10B, respectively. For brevity, it is assumed herein that the logic regions 200A and 200B are disposed in the central regions of the semiconductor devices 10A and 10B, respectively, and the analog core regions 400A and 400B and the I/O circuit regions 500A and 500B are disposed in the outer regions of the semiconductor devices 10A and 10B, respectively.

Figure 2:
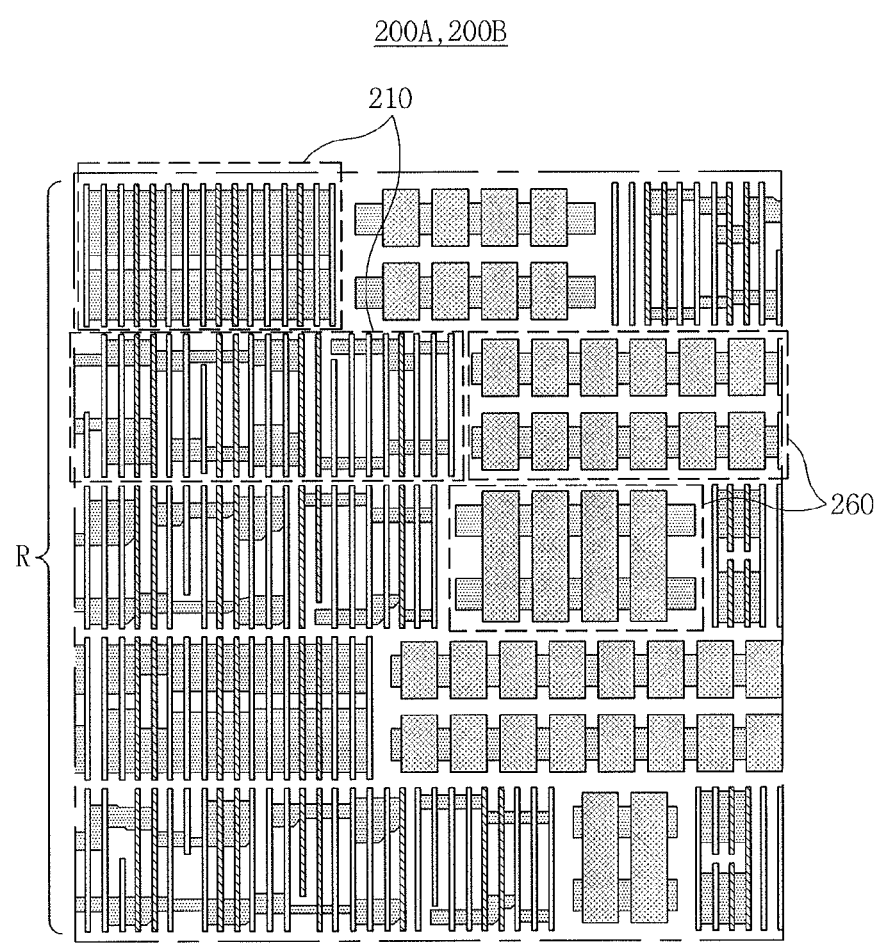
FIG. 2 illustrates a schematic enlarged layout of portions of logic regions of semiconductor devices according to an embodiment.

FIG. 2 illustrates a schematic enlarged layout of portions of logic regions 200A and 200B of semiconductor devices 10A and 10B according to an embodiment. Referring to FIG. 2, each of logic regions 200A and 200B of the semiconductor devices 10A and 10B according to an embodiment may include a plurality of rows R. Each of the rows R may include a plurality of transistor blocks 210 and a plurality of capacitor blocks 260. The transistor blocks 210 and the capacitor blocks 260 may be disposed at random.

Figure 3A:
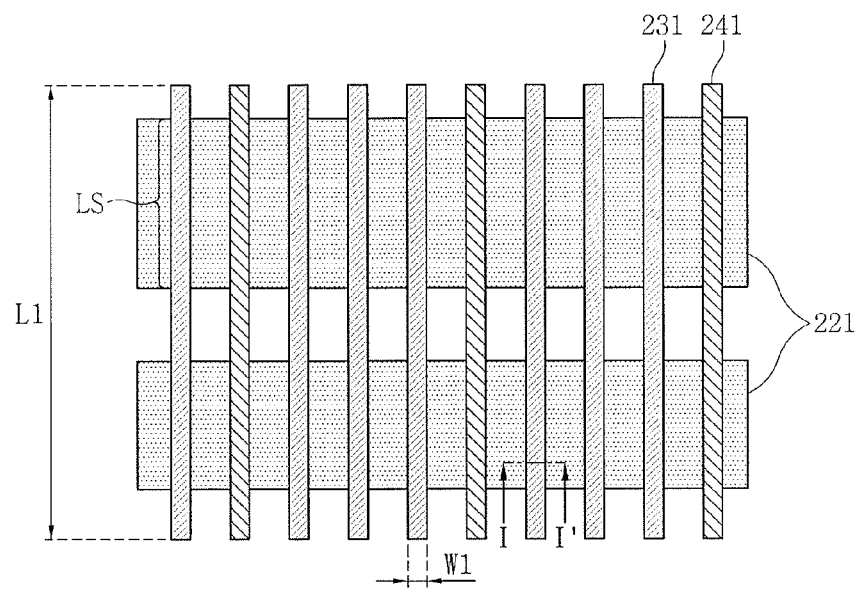
FIGS. 3A and 3B illustrate respectively, enlarged layouts of arbitrary ones of transistor blocks of FIG. 2.
Figure 3B:
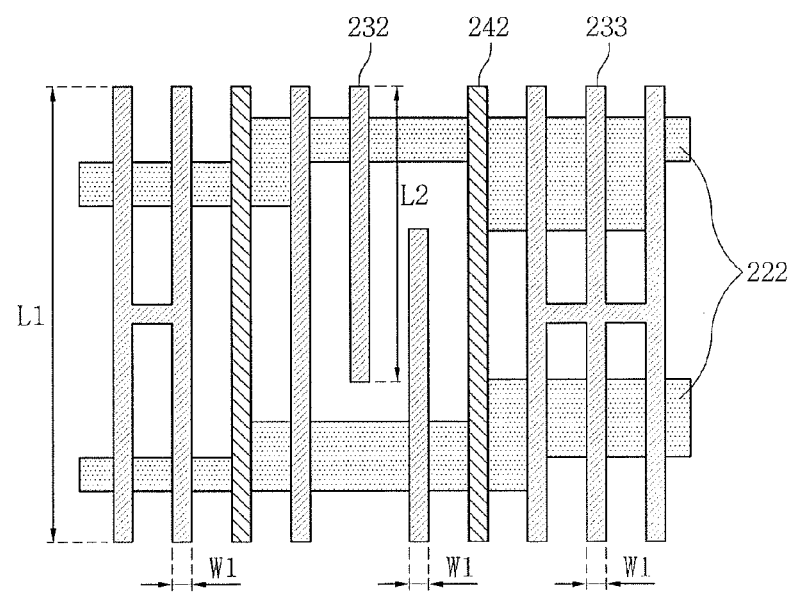

FIGS. 3A and 3B respectively illustrate enlarged layouts of arbitrary ones of the transistor blocks 210 of FIG. 2. Referring to FIG. 3A, each of the semiconductor devices 10A and 10B according to an embodiment may include first logic active regions 221 and first logic transistors 231 disposed in the transistor block 210. Each of the semiconductor devices 10A and 10B may further include first logic dummy transistors 241.

The first logic active regions 221 may extend or be elongated parallel to the rows R. The first logic active regions 221 may have long sides that are even or parallel to one another.

For example, the first logic active regions 221 may have rectangular shapes elongated in a horizontal direction such that opposite sides of the first logic active regions 221 are parallel to one another. The first logic active regions 221 may have bar shapes. The first logic active regions 221 may have even sides.

The first logic transistors 231 may have line, bar, or stick shapes extending at right angles to the rows R. The first logic transistors 231 may be disposed parallel to one another or side by side. The first logic transistors 231 may extend in a perpendicular direction to a direction in which the first logic active regions 221 extend. The first logic transistors 231 may have a uniform widths W1 and lengths L1. Electrical properties of the first logic transistors 231 may significantly affect performances of the semiconductor devices 10A and 10B. Accordingly, the first logic transistors 231 may be designed to have a constant width W1 and length L1 so that the first logic transistors 231 may have an overall equivalent performance. The length L1 of the first logic transistors 231 may be about several times greater than the width W1 thereof. For example, the length L1 of the first logic transistors 231 may be about five to twenty times greater than the width W1 thereof. Long sides of the first logic transistors 231 may cross or abut the first logic active regions 221. A length LS of the sides of the first logic transistors 231 that may cross or abut the first logic active regions 221 may define a channel width of the first logic transistors 231. The width W1 of the first logic transistors 231 may define a channel length of the first logic transistors 231. Accordingly, the width W1 of the first logic transistors 231 and the length LS of the long sides of the first logic transistors 231 that may cross or abut the first logic active regions 221 may be defined as channels of the first logic transistors 231.

The first logic dummy transistors 241 may be disposed adjacent to the first logic transistors 231. The first logic dummy transistors 241 may be disposed parallel to the first logic transistors 231. The first logic dummy transistors 241 may overlap the first logic active regions 221. The first logic dummy transistors 241 may have a length or width substantially equal or similar to that of the first logic transistors 231. In other implementations, the first logic dummy transistors 241 may have a width smaller than the width W1 of the first logic transistors 231. The first logic dummy transistors 241 may have the same shape as the first logic transistors 231.

Referring to FIG. 3B, each of the semiconductor devices 10A and 10B according to the embodiment may further include second logic active regions 222 disposed in the transistor block 210, and second and/or third logic transistors 232 and/or 233 crossing the second logic active regions 222. Each of the semiconductor devices 10A and 10B may further include second logic dummy transistors 242.

The second logic transistors 232 may have a length L2 smaller than the length L1 of the first logic transistors 231. The third logic transistors 233 may have a bridged shape. For instance, each of the third logic transistors 233 may have a shape formed by connecting a plurality of first logic transistors 231. The second logic transistors 232 may cross or abut one second logic active region 222. The third logic transistors 233 may cross or abut a plurality of second logic active regions 222. Accordingly, the first logic transistors 231, the second logic transistors 232, and the third logic transistors 233 may have various channel widths and various electrical properties. The first through third logic transistors 231, 232, and 233 may have the same width W1. The first and third logic transistors 231 and 233 may have the same length L1.

Long sides of the second logic active regions 222 may not be even. Referring back to FIG. 2, the long sides of the second logic active regions 222 may be rugged or rough. Accordingly, the long sides of the second and third logic transistors 232 and 233 may cross and/or abut the second logic active regions 222 at various lengths. Therefore, the second and third logic transistors 231 and 232 may have more various channel widths and electrical properties.

The second logic dummy transistors 242 may be disposed adjacent to the second logic transistors 232 and/or the third logic transistors 233. The second logic dummy transistors 242 may be disposed parallel to the second logic transistors 232 and/or the third logic transistors 233. The second logic dummy transistors 242 may overlap the second logic active regions 222. The second logic dummy transistors 242 may have a length or width substantially equal or similar to the second logic transistors 232 or the third logic transistors 233. In other implementations, the second logic dummy transistors 242 may have a width smaller than the width W2 of the second logic transistors 232 or the third logic transistors 233.

For brevity, it is assumed in FIGS. 3A and 3B that the widths W1 or lengths L1 and L2 of the logic transistors 231, 232, and 233 or the logic dummy transistors 241 and 242 correspond to the overall width of the logic transistors 231, 232, and 233 or the logic dummy transistors 241 and 242, or the width of electrodes. However, FIGS. 3A and 3B illustrate layouts. Accordingly, it is to be understood that the width W1 or lengths L1 and L2 of the logic transistors 231, 232, and 233 or the logic dummy transistors 241 and 242 may respectively be the sums of the widths of electrodes of the logic transistors 231, 232, and 233 or the logic dummy transistors 241 and 242 and the widths of portions of spacers. This will be understood with reference to longitudinal sections of the logic transistors 231, 232, and 233.

Figure 4A:
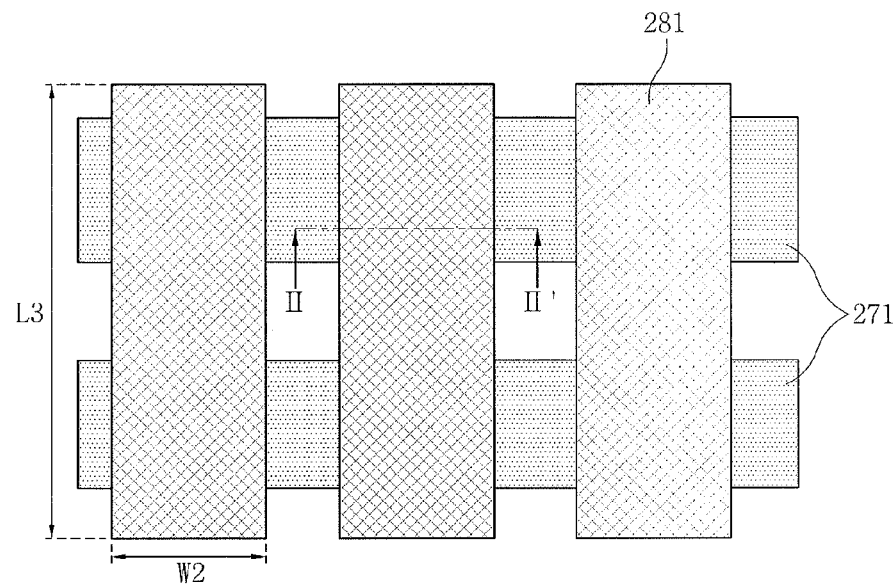
FIGS. 4A and 4B respectively illustrate enlarged layouts of arbitrary ones of capacitor blocks of semiconductor devices according to an embodiment.
Figure 4B:
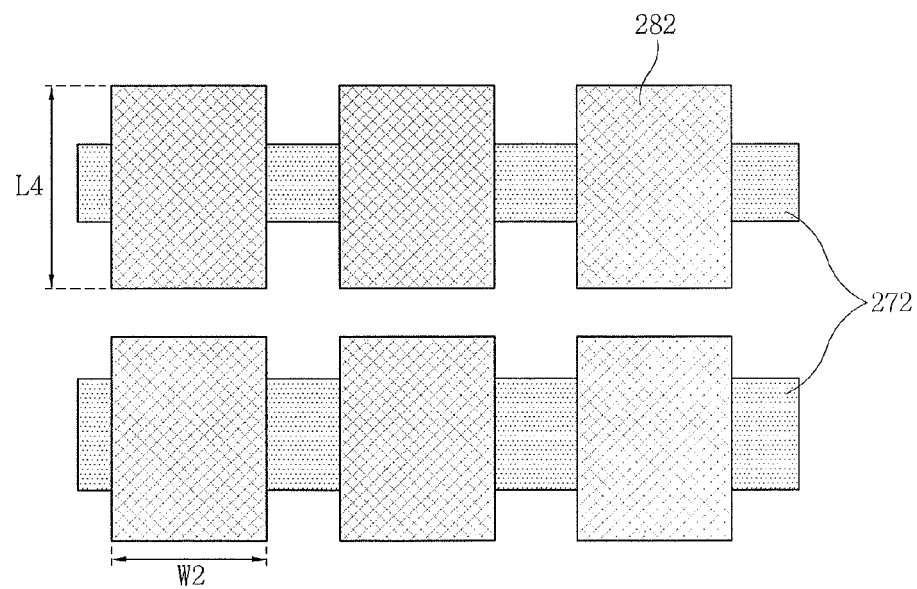

FIGS. 4A and 4B respectively illustrate enlarged layouts of arbitrary ones of the capacitor blocks 260 of semiconductor devices 10A and 10B according to an embodiment. Referring to FIG. 4A, each of the semiconductor devices 10A and 10B according to the embodiment may include first capacitor active regions 271 disposed in the capacitor block 260, and first decoupling capacitors 281 overlapping the first capacitor active regions 271.

The first capacitor active regions 271 may extend or be elongated parallel to the rows R. The first capacitor active regions 271 may have even sides. For example, the first capacitor active regions 271 may have bar or tetragonal shapes elongated in a lateral direction such that opposite sides of the first capacitor active regions 271 are parallel to one another.

The first decoupling capacitors 281 may have bar or box shapes elongated in a perpendicular direction to the rows R. For instance, each of the first decoupling capacitors 281 may overlap at least two capacitor active regions 271. The first decoupling capacitors 281 may be disposed parallel to one another or side by side. The first decoupling capacitors 281 may have the same width W2 and the same length L3. For example, the first decoupling capacitors 281 may have the same size. The length L3 of the first decoupling capacitors 281 may be about several times greater than the width W2 thereof. For example, the length L3 of the first decoupling capacitors 281 may be about two to ten times greater than the width W2 thereof. The first decoupling capacitors 281 may overlap equal areas of the first capacitor active regions 271. Accordingly, the first decoupling capacitors 281 may have the same capacitance. Although FIGS. 4A and 4B exemplarily illustrate two first capacitor active regions 271, three or more first capacitor active regions 271 may be provided. The width W2 of the first decoupling capacitors 281 may be at least several tens of times greater than the width W1 of the logic transistors 231, 232, and 233. For example, the width W2 of the first decoupling capacitors 281 may be about at least ten times greater than the width W1 of the first logic transistors 231. The length L3 of the first decoupling capacitors 281 may be equal to the length L1 of the first logic transistors 231.

Referring to FIG. 4B, each of the semiconductor devices 10A and 10B according to an embodiment may include second capacitor active regions 272 disposed in the capacitor block 260, and second decoupling capacitors 282 overlapping the second capacitor active regions 272. The second decoupling capacitors 282 may have square or box shapes. The second decoupling capacitors 282 may have the same width W2 as the first decoupling capacitors 281. The second decoupling capacitors 282 may have a length L4 less than the length L3 of the first decoupling capacitors 281. The length L4 of the second decoupling capacitors 282 may be equal to or greater than the width W2 of the first decoupling capacitors 281. In other implementations, the length L4 of the second decoupling capacitors 282 may be less than twice the width W2 of the first decoupling capacitors 281. The second decoupling capacitors 282 may overlap one second active region 272. The second decoupling capacitors 282 may be disposed parallel to one another or side by side. For example, the second decoupling capacitors 282 may be disposed in grating-type island shapes. The transistor blocks 210 and the capacitor blocks 260 may be separated from one another. Accordingly, the logic active regions 221 and 222 and the capacitor active regions 271 and 272 may be separated from one another.

For brevity, it may be assumed in FIGS. 4A and 4B that the widths W2 or lengths L3 and L4 of the decoupling capacitors 281 and 282 correspond to the overall widths or lengths of the decoupling capacitors 281 and 282, or the widths or lengths of electrodes. However, FIGS. 4A and 4B illustrate layouts. Accordingly, it is to be understood that the widths W2 or lengths L3 and L4 of the decoupling capacitors 281 and 282 may respectively be the sums of the widths or lengths of portions of electrodes or spacers of the decoupling capacitors 281 and 282. This will be understood with reference to longitudinal sections of the decoupling capacitors 241 and 242.

Referring to FIGS. 3A through 4B, the semiconductor devices 10A and 10B according to the embodiments may include logic transistors 231 and 232 having line, bar, or stick shapes with the overall same or similar widths W1 in the logic regions 200A and 200B, respectively. Also, the logic transistors 231 and 232 may have substantially the same or similar lengths L1 and L2. The lengths L1 and L2 of the logic transistors 231 and 232 may significantly affect the electrical properties of the logic transistors 231 and 232, respectively. For stability of design and manufacturing process, the logic transistors 231 and 232 may be designed to have a unified model. When the logic transistors 231 and 232 are unified, optimizing the manufacturing process may be facilitated. Thus, each of the transistors 231 and 232 can be manufactured to have predetermined performance, thereby greatly affecting the stabilization of the manufacturing process.

The semiconductor devices 10A and 10B according to the embodiments may include square or box-shaped decoupling capacitors 281 and 282 having a width W2 at least several tens of times greater than the width W1 of the line-shaped logic transistors 231 and 232 in the logic regions 200A and 200B. The square-shaped decoupling capacitors 281 and 282 may have higher capacitances than line-shaped capacitors in the same occupied areas and thus, may be advantageous to improving integration density and miniaturization. For example, to obtain the same capacitances, the square- or box-shaped decoupling capacitors 281 and 282 may have simpler shapes than the line-shaped capacitors. As a result, patterning processes (e.g., a photolithography process, an etching process, and a deposition process) for forming the square- or box-shaped decoupling capacitors 281 and 282 may be facilitated. When the first and second decoupling capacitors 281 and 282 have square or box shapes in the logic regions 200A and 200B, the total perimeter per area of each of the first through third logic transistors 231, 232, and 233 and the first and second decoupling capacitors 281 and 282 may be reduced more than when the first and second decoupling capacitors 281 and 282 have line, bar, or stick shapes.

Figure 5A:
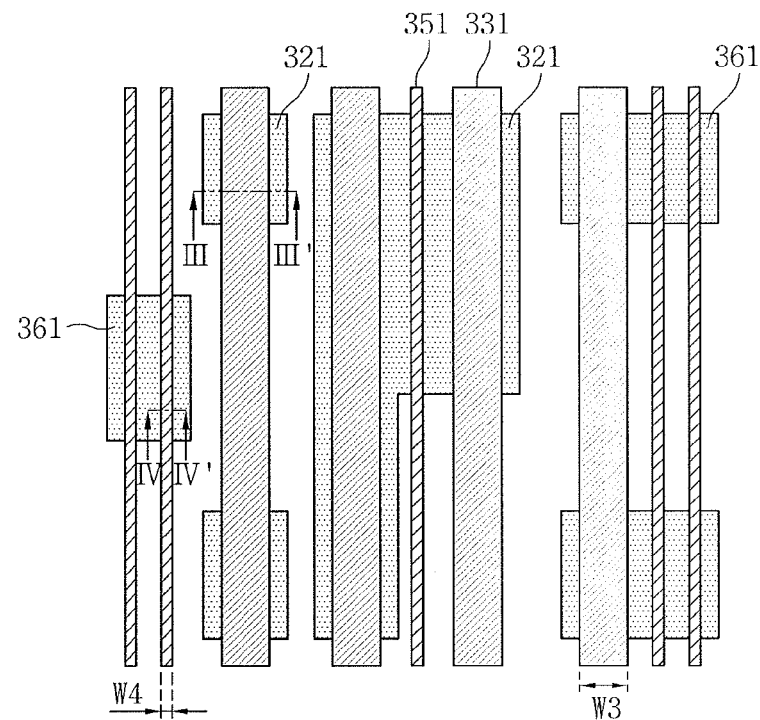
FIGS. 5A and 5B illustrate schematic enlarged layouts of arbitrary ones of peripheral regions of semiconductor devices according to an embodiment.
Figure 5B:
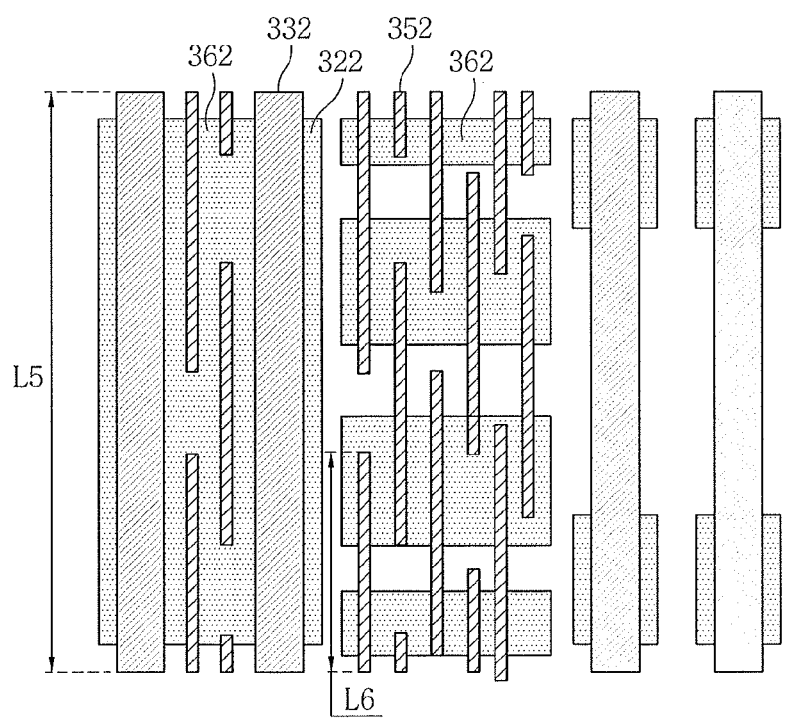

FIGS. 5A and 5B illustrate schematic enlarged layouts of arbitrary ones of peripheral regions 300A and 300B of semiconductor devices 10A and 10B according to an embodiment. As mentioned above, the peripheral regions 300A and 300B may include analog core regions 400A and 400B and/or I/O circuit regions 500A and 500B.

Referring to FIG. 5A, the peripheral regions 300A and 300B of the semiconductor devices 10A and 10B according to the embodiment may include first peripheral active regions 321, first peripheral transistors 331, first dummy active regions 361, and first peripheral dummy transistors 351.

The first peripheral active regions 321 may overlap the first peripheral transistors 331 in various manners. For example, one first peripheral transistor 331 may overlap one first peripheral active region 321, one first peripheral transistor 331 may overlap a plurality of first peripheral active regions 321, or a plurality of first peripheral transistors 331 may overlap one first peripheral active region 321.

The first peripheral transistors 331 may have a width W3 at least several times greater than the width W1 of the first through third logic transistors 231, 232, and 233. For example, the width W3 of the first peripheral transistors 331 may be about five to twenty times greater than the width W1 of the first through third logic transistors 231, 232, and 233. Accordingly, the first peripheral transistors 331 may have a greater channel length than the first through third logic transistors 231, 232, and 233. The first peripheral transistors 331 may have line, bar, or stick shapes.

The first dummy active regions 361 may overlap the first peripheral dummy transistors 351 in various ways. The first dummy active regions 361 may be connected to the first peripheral active regions 321.

The first peripheral dummy transistors 351 may be disposed between the first peripheral transistors 331 and/or adjacent to the first peripheral transistors 331. The first peripheral dummy transistors 351 may have line, bar, or stick shapes. The first peripheral dummy transistors 351 may have a length L5 at least several times greater than a width W4 thereof. For example, the length L5 of the first peripheral dummy transistors 351 may be at least ten times greater than the width W4 thereof. The first peripheral dummy transistors 351 may overlap the first dummy active regions 361 connected to the first peripheral active regions 321.

The width W3 of the first peripheral transistors 331 may be greater than the width W4 of the first peripheral dummy transistors 351. For instance, the width W3 of the first peripheral transistors 331 may be about two to ten times greater than the width W4 of the first peripheral dummy transistors 351.

Referring to FIG. 5B, each of the peripheral regions 300A and 300B of the semiconductor devices 10A and 10B according to the embodiment may include second peripheral active regions 322, second peripheral transistors 332, second dummy active regions 362, and second peripheral dummy transistors 352.

The second peripheral active regions 322 and the second dummy active regions 362 may have square or box shapes. One second peripheral active region 322 may overlap a plurality of second peripheral transistors 322. The second peripheral active regions 322 may be connected to the second dummy active regions 362. In other implementations, the second dummy active regions 362 may be separated from one another.

The second peripheral dummy transistors 352 may be disposed between the second peripheral active regions 322, between the second peripheral transistors 332, and/or adjacent thereto. The second peripheral dummy transistors 352 may have line, bar, or stick shapes. The second peripheral dummy transistors 352 may be disposed parallel to one another. The second peripheral dummy transistors 352 may be spaced a predetermined distance apart from one another in the same straight line. The second peripheral dummy transistors 352 may not be aligned with one another but disposed at random. A length L5 of the second peripheral transistors 332 may be greater than a length L6 of the second peripheral dummy transistors 352.

For brevity, it is assumed in FIGS. 5A and 5B that the widths W3 and W4 or lengths L5 and L6 of the peripheral transistors 331 and 332 or the peripheral dummy transistors 351 and 352 correspond to the overall width of the peripheral transistors 331 and 332 or the peripheral dummy transistors 351 and 352, or the width of electrodes. However, FIGS. 5A and 5B illustrate layouts. Accordingly, it is to be understood that the widths W3 and W4 or lengths L5 and L6 of the peripheral transistors 331 and 332 or the peripheral dummy transistors 351 and 352 may respectively be the sums of the widths of electrodes of the peripheral transistors 331 and 332 or the peripheral dummy transistors 351 and 352 and the widths of portions of spacers. This will be understood with reference to longitudinal sections of the peripheral transistors 331 and 332 or the peripheral dummy transistors 351 and 352.

In the peripheral regions 300A and 300B, the first and second peripheral dummy transistors 351 and 352 may have line, bar, or stick shapes so that the total perimeter per area of the first and second peripheral transistors 331 and 332 and the first and second peripheral dummy transistors 351 and 352 can increase more than when the first and second peripheral dummy transistors 351 and 352 have square or box shapes.

According to embodiments, the total perimeter of patterns including the logic transistors 231, 232, and 233 and the decoupling capacitors 281 and 282 in the logic regions 200A and 200B may be reduced, and the total perimeter of patterns including the peripheral transistors 331 and 332 and the peripheral dummy transistors 351 and 352 in the peripheral regions 300A and 300B may be increased. Accordingly, a difference between the total perimeter of the logic regions 200A and 200B and the total perimeter of the peripheral regions 300A and 300B may be reduced.

Figure 6A:
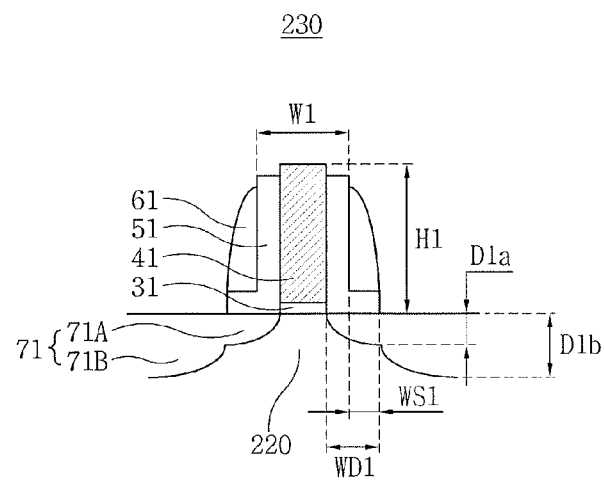
FIG. 6A illustrates a schematic longitudinal sectional view of a first logic transistor taken along direction I-I' of FIG. 3A.

FIG. 6A illustrates a schematic longitudinal sectional view of the first logic transistor 231, which is taken along direction I-I' of FIG. 3A. Although FIG. 6A illustrates the longitudinal sectional view of the first logic transistor 233, it may be assumed that FIG. 6A may also represent a longitudinal sectional view of the second logic transistor 232 or the third logic transistor 233. Accordingly, respective components will be hereinafter called representative names and denoted by representative reference numerals.

Referring to FIG. 6A, a logic transistor 230 according to an embodiment may include a logic transistor gate insulating layer 31, a logic transistor gate electrode 41, inner logic transistor spacers 51, and outer logic transistor spacers 61 disposed on a logic active region 220 of a substrate 20.

Sidewalls of the logic transistor gate insulating layer 31 may be vertically aligned with sidewalls of the logic transistor gate electrode 41. The logic transistor gate insulating layer 31 and the logic transistor gate electrode 41 may have a first height H1.

The inner logic transistor spacers 51 may be conformally formed on the sidewalls of the logic transistor gate insulating layer 31 and the sidewalls of the logic transistor gate electrode 41. Upper portions of the inner logic transistor spacers 51 may have a similar or substantially equal horizontal width to lower portions thereof. Lower end portions of the inner logic transistor spacers 51 may extend onto the substrate 20. For example, the inner logic transistor spacers 51 may be formed using an atomic layer deposition (ALD) process. Accordingly, the inner logic transistor spacers 51 may have overall uniform thickness and width. It is to be understood that a width W1 of the above-described logic transistors 230, 231, and 232 may be the sum of widths of the logic transistor gate electrode 41 and the inner logic transistor spacers 51.

The outer logic transistor spacers 61 may be formed on side surfaces of the inner logic transistor spacers 51. The outer logic transistor spacers 61 may have narrow upper portions and wide lower portions. The outer logic transistor spacers 61 may be formed on the lower end portions of the inner logic transistor spacers 51 that may extend onto the substrate 20. For example, the outer logic transistor spacers 61 may be formed using a chemical vapor deposition (CVD) process and an etchback process. Accordingly, the outer logic transistor spacers 61 may have narrow upper portions and wide lower portions.

Outer side surfaces of the lower end portions of the inner logic transistor spacers 51 extending onto the substrate 20 may be vertically aligned with outer side surfaces of the outer logic transistor spacers 61. For example, the lower end portions of the inner logic transistor spacers 51 extending onto the substrate 20 may have the same maximum horizontal width as the outer logic transistor spacers 61.

The logic transistor 230 may have a first total spacer width WD1, which may be defined as a distance from a side surface of the logic transistor gate insulating layer 31 or the logic transistor gate electrode 41 to outer side surfaces of the lower end portions of the inner logic transistor spacers 51.

The outer logic transistor spacers 61 of the logic transistor 230 may have a first outer width WS1, which may be defined as the maximum horizontal width of the outer logic transistor spacers 61.

A top surface of the logic transistor gate electrode 41 may not be covered with the inner logic transistor spacers 51 and/or the outer logic transistor spacers 61. A top end portion of the side surface of the logic transistor gate electrode 41 may not be covered with the inner logic transistor spacers 51 and/or the outer logic transistor spacers 61. Top end portions of the side surfaces of the inner logic transistor spacers 51 may not be covered with the outer logic transistor spacers 61.

Logic transistor doping regions 71 may be formed in the substrate 20. The logic transistor doping regions 71 may include low-concentration logic transistor doping regions 71A and high-concentration logic transistor doping regions 71B. One end portions of the low-concentration logic transistor doping regions 71A may be vertically aligned with sidewalls of the logic transistor gate insulating layer 31 or the logic transistor gate electrode 41. One end portions of the high-concentration doping regions 71B may be vertically aligned with outer side surfaces of lower end portions of the inner logic transistor spacers 41 or outer side surfaces of the outer logic transistor spacers 61. The high-concentration logic transistor doping regions 71B may be formed to a greater depth than the low-concentration logic transistor doping regions 71A. For instance, a depth D1b from the surface of the substrate 20 to bottom surfaces of the high-concentration logic transistor doping regions 71B may be greater than a depth D1a from the surface of the substrate 20 to bottom surfaces of the low-concentration logic transistor doping regions 71A.

The substrate 20 may be a silicon wafer, a silicon-on-insulator (SOI) wafer, a silicon-germanium (SiGe) wafer, or one of other various semiconductor wafers. The logic active region 220 may contain a dopant and be a portion of the substrate 20. The logic transistor gate insulating layer 31 may include an insulating material, such as silicon oxide, silicon oxynitride, or a metal oxide. The logic transistor gate electrode 41 may include a conductive material, such as doped silicon, a metal silicide, a metal, or a metal compound. The inner logic transistor spacer 51 may include silicon oxide. The outer logic transistor spacer 61 may include silicon nitride. The logic transistor doping regions 71 may contain a dopant. For example, the dopant may include an n-type Group V element, such as arsenic (As) or phosphorus (P), or a p-type Group III element, such as boron (B). The logic active region 220 may include a dopant having an opposite polarity to the logic transistor doping regions 71.

Figure 6B:
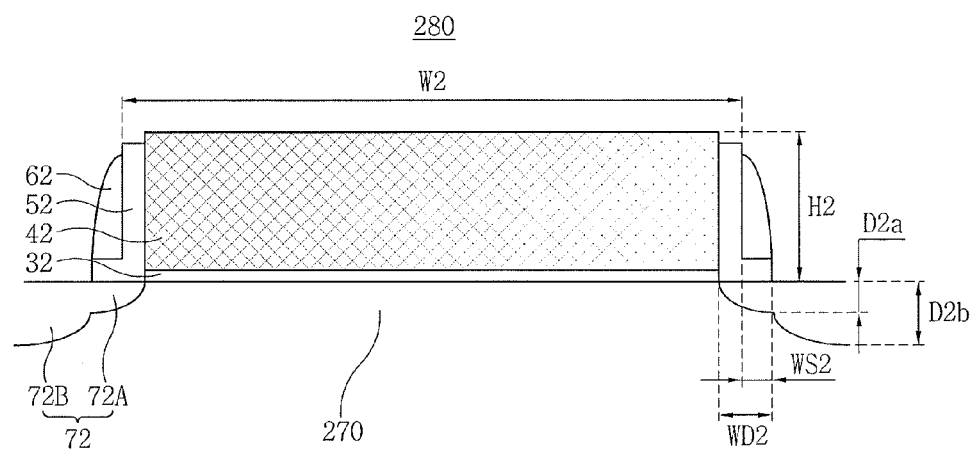
FIG. 6B illustrates a schematic longitudinal sectional view of a first decoupling capacitor taken along direction II-II' of FIG. 4A.

FIG. 6B illustrates a schematic longitudinal sectional view of the first decoupling capacitor 281, which is taken along direction II-II' of FIG. 4A. Although FIG. 6B illustrates the longitudinal sectional view of the first decoupling capacitor 281, it may be assumed that FIG. 6B also represents a longitudinal sectional view of the second decoupling capacitor 282. Accordingly, respective components will be hereinafter called representative names and denoted by representative reference numerals.

Referring to FIG. 6B, a decoupling capacitor 280 according to an embodiment may include a capacitor dielectric layer 32, a capacitor electrode 42, inner capacitor spacers 52, and outer capacitor spacers 62, which may be disposed on a capacitor active region 270 of a substrate 20.

The capacitor dielectric layer 32 may be vertically aligned with sidewalls of the capacitor electrode 42. The capacitor dielectric layer 32 and the capacitor electrode 42 may have a second height H2. The second height H2 may be substantially equal to the first height H1.

The inner capacitor spacers 51 may be conformally formed on sidewalls of the capacitor insulating layer 32 and sidewalls of the capacitor electrode 42. Upper portions of the inner capacitor spacers 52 may have a horizontal width similar or substantially equal to lower portions thereof. Lower end portions of the inner capacitor spacers 52 may extend onto the substrate 20. For example, the inner capacitor spacers 52 may be formed using an ALD process. Accordingly, the inner capacitor spacers 52 may have overall uniform thickness and width. A width W2 of the above-described decoupling capacitors 280, 281, and 282 may be interpreted as the sum of the widths of the capacitor electrode 42 and the inner capacitor spacers 52.

The outer capacitor spacers 62 may be formed on one side surfaces of the inner capacitor spacers 52. The outer capacitor spacers 62 may have narrow upper portions and wide lower portions. The outer capacitor spacers 62 may be formed on lower end portions of the inner capacitor spacers 52 extending onto the substrate 20. For example, the outer capacitor spacers 62 may be formed using a CVD process and an etchback process. Accordingly, the outer capacitor spacers 62 may have narrow upper portions and wide lower portions. Outer side surfaces of the lower end portions of the inner capacitor spacers 52 extending onto the substrate 20 may be vertically aligned with outer side surfaces of the outer capacitor spacers 62. For example, the lower end portions of the inner capacitor spacers 52 extending onto the substrate 20 may have the maximum horizontal width as the outer capacitor spacers 62.

The decoupling capacitor 280 may have a second total spacer width WD2, which may be defined as a distance from side surfaces of the capacitor insulating layer 32 or the capacitor electrode 42 to the outer side surfaces of the lower end portions of the inner capacitor spacers 52.

The outer capacitor spacers 62 of the decoupling capacitor 280 may have a second outer width WS2, which may be defined as the maximum horizontal width of the outer capacitor spacers 62. The second outer width WS2 may be substantially equal to the first outer width WS1.

A top surface of the capacitor electrode 42 may not be covered with the inner capacitor spacers 52 and/or the outer capacitor spacers 62. Top end portions of the side surfaces of the capacitor electrode 42 may not be covered with the inner capacitor spacers 52 and/or the outer capacitor spacers 62. Top end portions of the side surfaces of the inner capacitor spacers 52 may not be covered with the outer capacitor spacers 62.

Capacitor doping regions 72 may be formed in the substrate 20. The capacitor doping regions 72 may include low-concentration capacitor doping regions 72A and high-concentration capacitor doping regions 72B. One end portions of the low-concentration capacitor doping regions 72A may be vertically aligned with sidewalls of the capacitor insulating layer 32 or the capacitor electrode 42. One end portions of the high-concentration capacitor doping regions 72B may be vertically aligned with outer side surfaces of lower end portions of the inner capacitor spacers 42 or outer side surfaces of the outer capacitor spacers 62. The high-concentration capacitor doping regions 72B may be formed to a greater depth than the low-concentration capacitor doping regions 72A. For example, a depth D2b from the surface of the substrate 20 to bottom surfaces of the high-concentration capacitor doping regions 72B may be greater than a depth D2a from the surface of the substrate 20 to bottom surfaces of the low-concentration capacitor doping regions 72A. The depth D1a of the low-concentration doping regions 71A may be substantially equal to the depth D2a of the low-concentration doping regions 72A. The depth D1b of the high-concentration doping regions 71B may be substantially equal to the depth D2b of the high-concentration doping regions 72B.

The capacitor active region 270 may be a portion of the substrate 20 containing a dopant. The capacitor insulating layer 32 may include an insulating material, such as silicon oxide, silicon oxynitride, or a metal oxide. The capacitor electrode 42 may include a conductive material, such as doped silicon, a metal silicide, a metal, or a metal compound. The inner capacitor spacers 52 may include silicon oxide. The outer capacitor spacers 62 may include silicon nitride. The capacitor doping regions 72 may include a dopant. For example, the dopant may include an n-type Group V element, such as arsenic (As) or phosphorus (P), or a p-type Group III element, such as boron (B). The capacitor active region 270 may include a dopant having an opposite polarity to the capacitor doping regions 72.

Figure 6C:
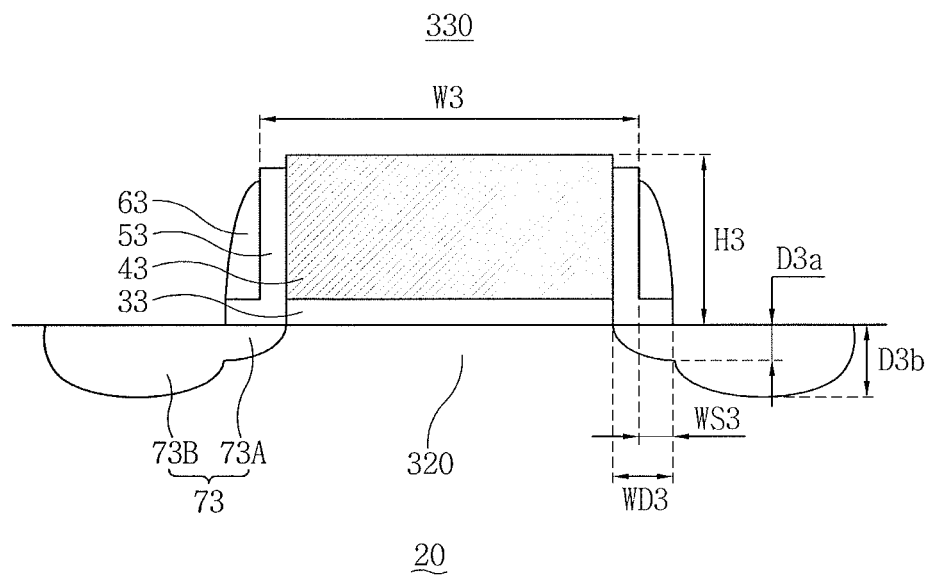
FIG. 6C illustrates a schematic longitudinal sectional view of a first peripheral transistor taken along direction III-III' of FIG. 5A.

FIG. 6C illustrates a schematic longitudinal sectional view of the first peripheral transistor 331, which is taken along direction III-III' of FIG. 5A. Although FIG. 6C illustrates the longitudinal sectional view of the first peripheral transistor 331, it may be assumed that FIG. 6C also represents a longitudinal sectional view of the second peripheral transistor 332. Accordingly, respective components will be hereinafter called representative names and denoted by representative reference numerals.

Referring to FIG. 6C, a peripheral transistor 330 according to an embodiment may include a peripheral transistor gate insulating layer 33, a peripheral transistor gate electrode 43, inner peripheral transistor spacers 53, and outer peripheral transistor spacers 63, which may be disposed on a peripheral active region 320 of a substrate 20.

Sidewalls of the peripheral transistor gate insulating layer 33 may be vertically aligned with sidewalls of the peripheral transistor gate electrode 43. The peripheral transistor gate insulating layer 33 and the peripheral transistor gate electrode 43 may have a third height H3. The third height H3 may be substantially equal to one of the first height H1 or the second height H2.

The inner peripheral transistor spacers 53 may be conformally formed on the sidewalls of the peripheral transistor gate insulating layer 33 and the sidewalls of the peripheral transistor gate electrode 43. Upper portions of the inner peripheral transistor spacers 53 may have a horizontal width similar or substantially equal to lower portions thereof. Lower end portions of the inner peripheral transistor spacers 53 may extend onto the substrate 20. A width W3 of the above-described peripheral transistors 330, 331, and 332 may be interpreted as the sum of the widths of the peripheral transistor gate electrode 43 and the inner peripheral transistor spacers 53.

The outer peripheral transistor spacers 63 may be formed on one side surfaces of the inner peripheral transistor spacers 53. The outer peripheral transistor spacers 63 may have narrow upper portions and wide lower portions. The outer peripheral transistor spacers 63 may be formed on the lower end portions of the inner peripheral transistor spacers 53, which may extend onto the substrate 20.

Outer side surfaces of the lower end portions of the inner peripheral transistor spacers 53, which may extend onto the substrate 20, may be vertically aligned with outer side surfaces of the outer peripheral transistor spacers 63. For example, the lower end portions of the inner peripheral transistor spacers 53, which may extend onto the substrate 20, may have the same maximum horizontal width as the outer peripheral transistor spacers 63.

The peripheral transistor 330 may have a third total spacer width WD3, which may be defined as a distance from side surfaces of the peripheral transistor gate insulating layer 33 or the peripheral transistor gate electrode 43 to the outer side surfaces of the lower end portions of the inner peripheral transistor spacers 53. The third total spacer width WD3 may be similar or substantially equal to the first total spacer width WD1 or the second total spacer width WD2.

The outer peripheral transistor spacers 63 of the peripheral transistor 330 may have a third outer width WS3, which may be defined as the maximum horizontal width of the outer peripheral transistor spacers 63. The third outer width WS3 may be similar to the first outer width WS1 or the second outer width WS2.

A top surface of the peripheral transistor gate electrode 43 may not be covered with the inner peripheral transistor spacers 53 and/or the outer peripheral transistor spacers 63. Top end portions of the side surfaces of the inner peripheral transistor spacers 53 may not be covered with the outer peripheral transistor spacers 63.

Peripheral transistor doping regions 73 may be formed in the substrate 20. The peripheral transistor doping regions 73 may include low-concentration peripheral transistor doping regions 73A and high-concentration peripheral transistor doping regions 73B. One end portions of the low-concentration peripheral transistor doping regions 73A may be vertically aligned with sidewalls of the peripheral transistor gate insulating layer 33 or the peripheral transistor gate electrode 43. One end portions of the high-concentration peripheral transistor doping regions 73B may be vertically aligned with outer side surfaces of lower end portions of the inner peripheral transistor spacers 43 or the outer side surfaces of the outer peripheral transistor spacers 63. The high-concentration peripheral transistor doping regions 73B may be formed to a greater depth than the low-concentration peripheral transistor doping region 73A. For example, a depth D3$b$ from the surface of the substrate 20 to bottom surfaces of the low-concentration peripheral transistor doping regions 73B may be greater than a depth D3$a$ from the surface of the substrate 20 to bottom surfaces of the low-concentration peripheral transistor doping regions 73A.

The peripheral active region 320 may be a portion of the substrate 20 containing a dopant. The peripheral transistor gate insulating layer 33 may include an insulating material, such as silicon oxide, silicon oxynitride, or a metal oxide. The peripheral transistor gate electrode 43 may include a conductive material, such as doped silicon, a metal silicide, a metal, or a metal compound. The inner peripheral transistor spacers 53 may include silicon oxide. The outer peripheral transistor spacers 63 may include silicon nitride. The peripheral transistor doping regions 73 may include a dopant. For example, the dopant may include an n-type Group V element, such as arsenic (As) or phosphorus (P), or a p-type Group III element, such as boron (B). The peripheral active region 320 may include a dopant having an opposite polarity to the peripheral transistor doping regions 73.

Figure 6D:
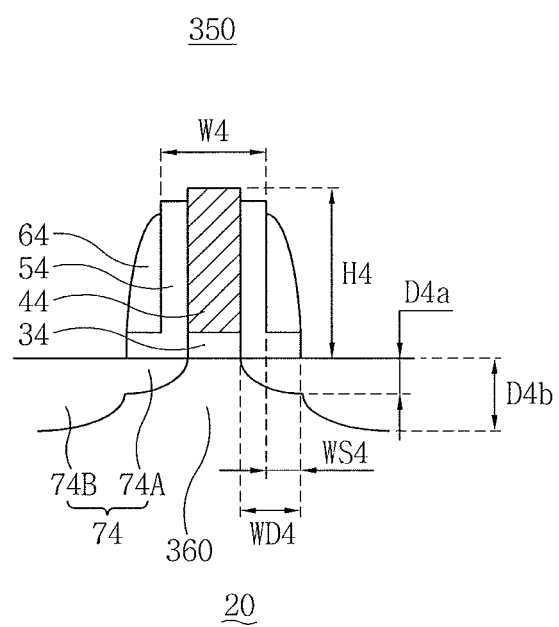
FIG. 6D illustrates a schematic longitudinal sectional view of a first peripheral dummy transistor taken along direction IV-IV' of FIG. 5A.

FIG. 6D illustrates a schematic longitudinal sectional view of the first peripheral dummy transistor 351, which is taken along direction IV-IV' of FIG. 5A. Although FIG. 6D illustrates the longitudinal sectional view of the first peripheral dummy transistor 351, it may be assumed that FIG. 6D also represents a longitudinal sectional view of the second peripheral dummy transistor 352. Accordingly, respective components will be hereinafter called representative names and denoted by representative reference numerals.

Referring to FIG. 6D, a peripheral dummy transistor 350 according to an embodiment may include a peripheral dummy transistor gate insulating layer 34, a peripheral dummy transistor gate electrode 44, inner peripheral dummy transistor spacers 54, and outer peripheral dummy transistor spacers 64, which may be formed on a dummy peripheral active region 360 formed in a substrate 20.

Sidewalls of the peripheral dummy transistor gate insulating layer 34 may be vertically aligned with sidewalls of the peripheral dummy transistor gate electrode 44. The peripheral dummy transistor gate insulating layer 34 and the peripheral dummy transistor gate electrode 44 may have a fourth height H4. The fourth height H4 may be substantially equal to one of the first through third heights H1 to H3.

The inner peripheral dummy transistor spacers 54 may be conformally formed on the sidewalls of the peripheral dummy transistor gate insulating layer 34 and the sidewalls of the peripheral dummy transistor gate electrode 44. Upper portions of the inner peripheral dummy transistor spacers 54 may have a horizontal width similar or substantially equal to lower end portions thereof. Lower end portions of the inner peripheral dummy transistor spacers 54 may extend onto the substrate 20. A width W4 of the above-described peripheral dummy transistors 350, 351, and 352 may be interpreted as the sum of the widths of the peripheral dummy transistor gate electrode 44 and the inner peripheral dummy transistor spacers 54.

The outer peripheral dummy transistor spacers 64 may be formed on one side surfaces of the inner peripheral dummy transistor spacers 54. The outer peripheral dummy transistor spacers 64 may have narrow upper portions and wide lower portions. The outer peripheral dummy transistor spacers 64 may be formed on lower end portions of the inner peripheral dummy transistor spacers 54, which may extend onto the substrate 20.

Outer side surfaces of the lower end portions of the inner peripheral dummy transistor spacers 54, which may extend onto the substrate 20, may be vertically aligned with outer side surfaces of the outer peripheral dummy transistor spacers 64. For example, the lower end portions of the inner peripheral dummy transistor spacers 54, which may extend onto the substrate 20, may have the maximum horizontal width as the outer peripheral dummy transistor spacers 64.

The peripheral dummy transistor 350 may have a fourth total spacer width WD4. The fourth total spacer width WD4 may be defined as a distance from side surfaces of the peripheral dummy transistor gate insulating layer 34 or the peripheral dummy transistor gate electrode 44 to the outer side surfaces of the lower end portions of the inner peripheral dummy transistor spacers 54. A fourth total spacer width WD4 may be similar to one of the first through third total spacer widths WD1 to WD3.

The outer peripheral dummy transistor spacers 64 of the peripheral dummy transistor 350 may have a fourth outer width WS4, which may be defined as the maximum horizontal width of the outer peripheral dummy transistor spacers 64. The fourth outer width WS4 may be similar to one of the first through fourth outer widths WS1 to WS3.

A top surface of the peripheral dummy transistor gate electrode 44 may not be covered with the inner peripheral dummy transistor spacers 54 and/or the outer peripheral dummy transistor spacers 64. Top end portions of the side surfaces of the peripheral dummy transistor gate electrodes 44 may not be covered with the inner peripheral dummy transistor spacers 54 and/or the outer peripheral dummy transistor spacers 64. Top end portions of the side surfaces of the inner peripheral dummy transistor spacers 54 may not be covered with the outer peripheral dummy transistor spacers 64.

Peripheral dummy transistor doping regions 74 may be formed in the substrate 20. The peripheral dummy transistor doping regions 74 may include low-concentration peripheral dummy transistor doping regions 74A and high-concentration peripheral dummy transistor doping regions 74B. One end portions of the low-concentration peripheral dummy transistor doping regions 74A may be vertically aligned with the sidewalls of the peripheral dummy transistor gate insulating layer 34 or the peripheral dummy transistor gate electrode 44. One end portions of the high-concentration peripheral dummy transistor doping regions 74B may be vertically aligned with outer side surfaces of lower end portions of the inner peripheral dummy transistor spacers 44 or the outer side surfaces of the outer peripheral dummy transistor spacers 64. The high-concentration peripheral dummy transistor doping regions 74B may be formed to a greater depth than the low-concentration peripheral dummy transistor doping regions 74A. For example, a depth D4$b$ from the surface of the substrate 20 to bottom surfaces of the high-concentration peripheral dummy transistor doping regions 74B, may be greater than a depth D4$a$ from the surface of the substrate 20 to bottom surfaces of the low-concentration peripheral dummy transistor doping regions 74A.

The dummy peripheral active region 360 may be a portion of the substrate 20 including a dopant. The peripheral dummy transistor gate insulating layer 34 may include an insulating material, such as silicon oxide, silicon oxynitride, or a metal oxide. The peripheral dummy transistor gate electrode 44 may include a conductive material, such as doped silicon, a metal silicide, a metal, or a metal compound. The inner peripheral dummy transistor spacers 54 may include silicide oxide. The outer peripheral dummy transistor spacers 64 may include silicon nitride. The peripheral dummy transistor doping regions 74 may include a dopant. For instance, the dopant may be an n-type Group V element, such as arsenic (As) or phosphorus (P), or a p-type Group III element, such as boron (B). The dummy peripheral active region 360 may include a dopant having an opposite polarity to the peripheral dummy transistor doping regions 74.

A chemical vapor deposition (CVD) process and an etchback process may be greatly affected by functional groups, such as ions or radicals. Accordingly, the volumes of the outer spacers 61, 62, 63, and 64 formed using a CVD process and an etchback process may vary according to areas of regions where the outer spacers 61, 62, 63, and 64 are to be formed, for example, the areas of the inner spacers 51, 52, 53, and 54. For example, ions or radicals required for forming the outer spacers 61, 62, 63, and 64 may be relatively deficient in regions where the inner spacers 51, 52, 53, and 54 occupy large areas or have a high density, while ions or radicals required for forming the outer spacers 61, 62, 63, and 64 are relatively abundant in regions where the inner spacers 51, 52, 53, and 54 occupy small areas or have a low density. The outer spacers 61, 62, 63, and 64 may have relatively small volumes in the regions where the ions or radicals for forming the outer spacers 61, 62, 63, and 64 are relatively deficient, and have relatively large volumes in the regions where the ions or radicals for forming the outer spacers 61, 62, 63, and 64 are relatively abundant. The volumes of the outer spacers 61, 62, 63, and 64 may greatly affect profiles of the doping regions 71, 72, 73, and 74. For instance, distances between the respective electrodes 41, 42, 43, and 44 and the high-concentration doping regions 71B, 72B, 73B, and 74B may vary according to regions, so performances of the logic transistors 231, 232, and 233 and the peripheral transistors 331 and 332 may become superfluous or deteriorate. The performances of the logic transistors 231, 232, and 233 and the peripheral transistors 331 and 332 may be as uniform as possible to increase stability. The outer spacers 61, 62, 63, and 64 may be formed in positions corresponding to outer surfaces of the inner spacers 51, 52, 53, and 54, and the inner spacers 51, 52, 53, and 54 may be formed to a uniform thickness on sidewalls of the insulating layers 31, 32, 33, and 34 and the electrodes 41, 42, 43, and 44. Accordingly, the volumes of the outer spacers 61, 62, 63, and 64 may be controlled by increasing or reducing the total area of the sidewalls of the insulating layers 31, 32, 33, and 34 and the electrodes 41, 42, 43, and 44. In the present embodiment, the box- or square-type decoupling capacitors 281 and 282 may reduce the total area of the sidewalls of the insulating layers 31, 32, 33, and 34 and the electrodes 41, 42, 43, and 44, and control the volumes of the outer spacers 61, 62, 63, and 64, while the peripheral dummy transistors 351 and 352 may increase the total area of the sidewalls of the insulating layers 31, 32, 33, and 34 and the electrodes 41, 42, 43, and 44 and control the volumes of the outer spacers 61, 62, 63, and 64.

For reference, an amount deposited due to a deposition process may increase with a rise in the density of ions or radicals, while an amount etched due to an etchback process may increase with the rise in density of the ions or radicals. Accordingly, in the logic regions 200A and 200B or the peripheral regions 300A and 300B, the outer spacers 61, 62, 63, and 64 having uniform volumes may be obtained by generally making the areas occupied by the outer surfaces of the inner spacers 51, 5, 53, and 54 similar to one another.

Figure 7A:
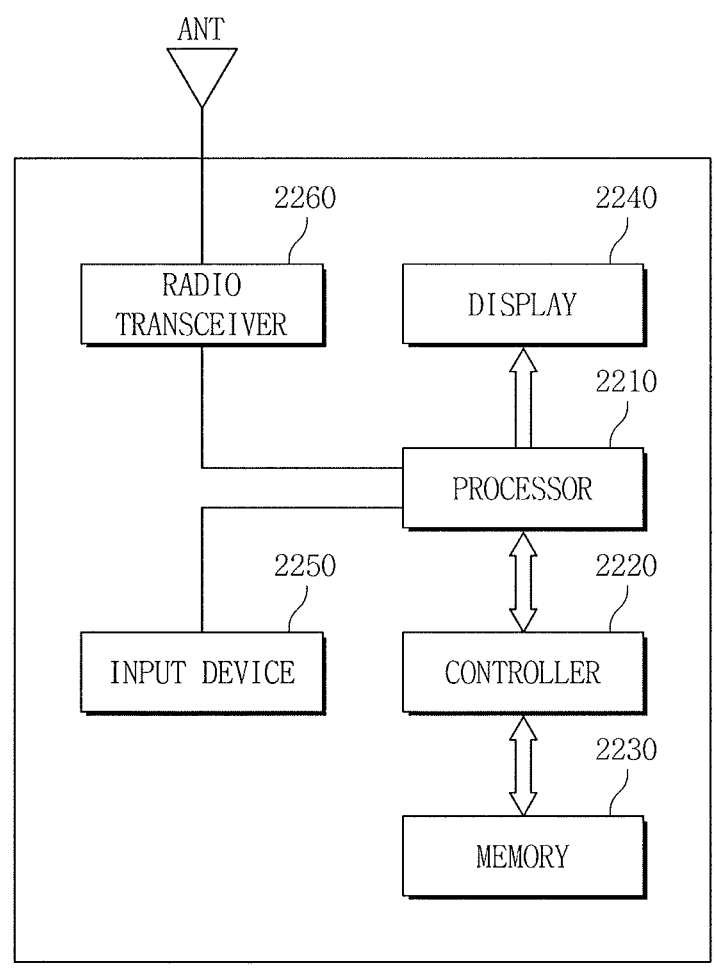
FIGS. 7A through 7C illustrate schematic block diagrams of electronic systems including at least one of semiconductor devices according to various embodiments.
Figure 7B:
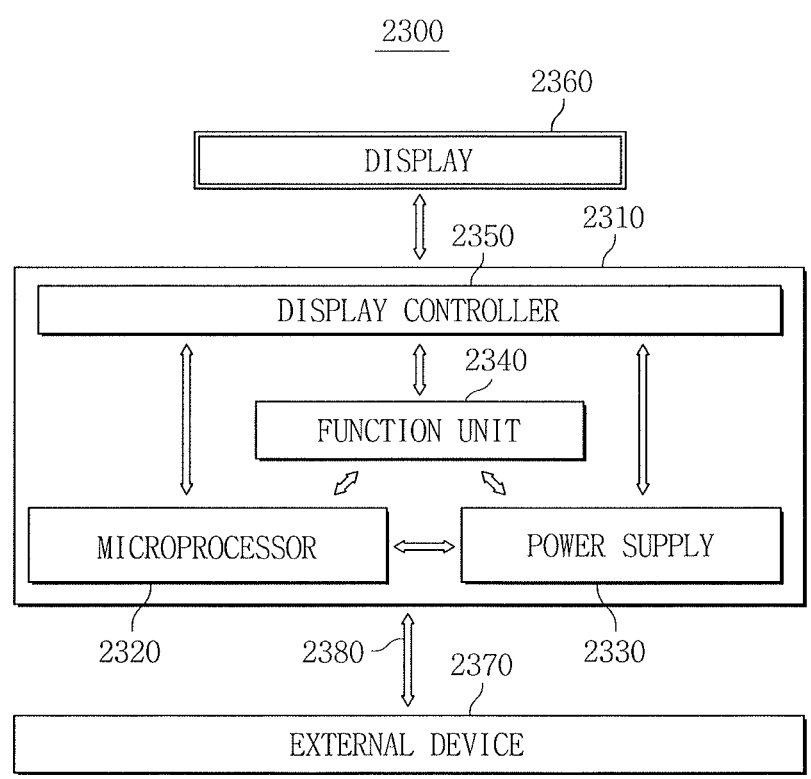
Figure 7C:
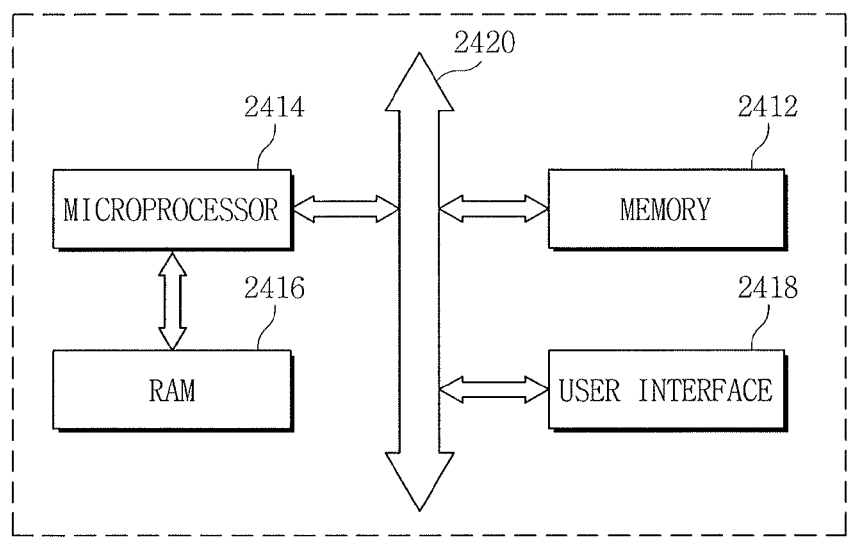

FIGS. 7A through 7C illustrate schematic block diagrams of electronic systems 2200, 2300, and 2400 including at least one of semiconductor devices 10A and 10B according to various embodiments.

Referring to FIG. 7A, an electronic system 2200 according to an embodiment may include a cellular phone, a smart phone, or a tablet personal computer (PC). The electronic system 2200 may include a processor 2210, a controller 2220, a memory 2230, a display 2240, an input device 2250, and a radio transceiver 2260. The processor 2210 may include one of the semiconductor devices 10A and 10B according to an embodiment. The processor 2210 may transmit and receive signals to and from the controller 2220. The controller 2220 may transmit and receive data to and from the memory 2230. For example, the processor 2210 may transmit and receive data to and from the memory 2230 through the controller 2220. The memory 2300 may include a dynamic random access memory (DRAM) or a flash memory. The processor 2210 may transmit electric signals to the display 2240. The display 2240 may receive the electric signals from the processor 2210 and generate visual images. The processor 2210 may receive command signals from the input device 2250. The input device 2250 may include a pointing device, such as a touch pad or a computer mouse, a keypad, or a keyboard. The processor 2210 may communicate with the radio transceiver 2260 and transmit and receive data. The radio transceiver 2260 may convert a radio signal received through an antenna ANT into an electric signal and transmit the electric signal to the processor 2210, or convert an electric signal received from the processor 2210 into a radio signal and externally transmit the radio signal.

FIG. 7B illustrates a schematic block diagram of an electronic system 2300 including at least one of semiconductor devices 10A and 10B according to various embodiments. Referring to FIG. 7B, the semiconductor devices 10A and 10B according to the various embodiments may be applied to the electronic system 2300. The electronic system 2300 may include a body 2310. The body 2310 may include a microprocessor (an MP unit) 2320, a power supply 2330, a function unit 2340, and/or a display controller 2350. The body 2310 may be a system board or mother board including a PCB. The MP unit 2320, the power supply 2330, the function unit 2340, and the display controller unit 2350 may be mounted on the body 2310. The display unit 2360 may be disposed on a top surface of the body 2310 or outside the body 2310. For example, the display unit 2360 may be disposed on the surface of the body 2310 and display an image processed by the display controller unit 2350. The power supply 2330 may function to receive a predetermined voltage from an external battery (not shown), divide the voltage into various voltage levels, and supply the divided voltages to the MP unit 2320, the function unit 2340, and the display controller unit 2350. The MP unit 2320 may receive a voltage from the power supply 2330 and control the function unit 2340 and the display unit 2360. The function unit 2340 may serve various functions of the electronic system 2300. For example, when the electronic system 2300 is a mobile electronic device, such as a portable phone, the function unit 2340 may include several components capable of serving wireless communication functions, for example, outputting an image to the display unit 2360 or outputting a voice to a speaker, by dialing or communicating with an external apparatus 2370. When a camera is also mounted, the function unit 2340 may serve as a camera image processor. In another embodiment, when the electronic system 2300 is connected to a memory card to increase capacity, the function unit 2340 may be a memory card controller. The function unit 2340 may transmit/receive signals to/from the external apparatus 2370 through a wired or wireless communication unit 2380. Furthermore, when the electronic system 2300 requires a universal serial bus (USB) to increase functionality, the function unit 2340 may serve as an interface controller. The semiconductor devices 10A and 10B according to various embodiments may be included in at least one of the MP unit 2320 and the function unit 2340.

FIG. 7C illustrates a schematic block diagram of another electronic system 2400 including at least one of semiconductor devices 10A and 10B according to various embodiments. Referring to FIG. 7C, the electronic system 2400 may include at least one of the semiconductor devices 10A and 10B according to the various embodiments. The electronic system 2400 may be used to fabricate a mobile device or a computer. For example, the electronic system 2400 may include a memory system 2412, a microprocessor (MP) 2414, a random access memory (RAM) 2416, and a user interface 2418 configured to communicate data using a bus 2420. The MP 2414 may program and control the electronic system 2400. The RAM 2416 may be used as an operation memory of the MP 2414. For example, the MP 2414 or the RAM 2416 may include at least one of the semiconductor devices 10A and 10B according to the embodiments. The MP 2414, the RAM 2416, and/or other elements may be assembled within a single package. The user interface 2418 may be used to input data to the electronic system 2400 or output data from the electronic system 2400. The memory system 2412 may store codes for operating the MP 2414, data processed by the MP 2414, or external input data. The memory system 2412 may include a controller and a memory.

Figure 7D:
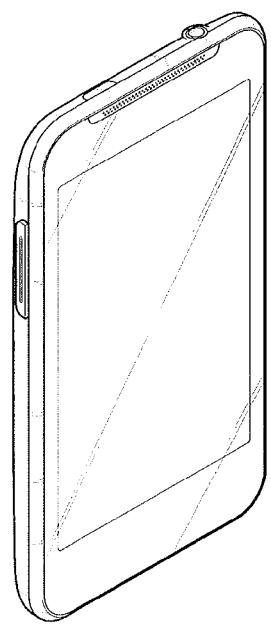
FIG. 7D illustrates a schematic diagram of a mobile device including at least one of semiconductor devices according to various embodiments.

FIG. 7D illustrates a schematic diagram of a mobile device 2500 including at least one of semiconductor devices 10A and 10B according to various embodiments. The mobile device 2500 may include a mobile phone or a tablet PC. In addition, at least one of the semiconductor devices 10A and 10B according to the various embodiments may be used not only for a mobile phone or a tablet PC but also for a portable computer such as a laptop computer, an MPEG-1 audio layer 3 (MP3) player, an MP4 player, a navigation device, a solid-state disk (SSD), a desktop computer, or electronic devices for automotive and household uses.

By way of summation and review, transistor-shaped patterns may include outer spacers including silicon nitride. The outer spacers including silicon nitride may be formed using a plasma-enhanced chemical vapor deposition (PECVD) process and a dry etchback process, which are techniques of forming patterns using functional groups, such as ions or radicals. These techniques of forming patterns using the functional groups may be greatly affected by a size of an area where spacers are to be formed, for example, the total perimeter of the patterns. When the total perimeter is large, the area where the spacers are to be formed is large. Thus, the density of the functional groups may be low, thereby lowering formation speed of the spacers. Conversely, when the total perimeter is small, the density of the functional groups may be high, thereby increasing the formation speed of the spacers.

When a difference in the total perimeter between a logic region and a peripheral region is great, the shape of patterns may be different from a designed shape according to the density of the patterns or the area or width of a region where the patterns are to be formed. For example, spacers formed in the logic region and the peripheral region may have different sizes due to a difference in the efficiency of formation of the spacers between the two regions. When the spacers are formed to different sizes, high-concentration doping regions may be formed against design rules, and transistors may have different performances.

Accordingly, to obtain uniform performances of transistors formed in a logic region and a peripheral region, it is desirable that areas where spacers are to be formed, for example, perimeters of transistor-shaped patterns, should be made uniform.

Embodiments provide a semiconductor device having a transistor-type decoupling capacitor disposed in a logic region.

Embodiments also provide a semiconductor device having a box-type decoupling capacitor disposed in a logic region.

Embodiments also provide a transistor-type dummy pattern disposed in a peripheral region.

Embodiments also provide a line-type dummy pattern disposed in a peripheral region.

Embodiments also provide a method of making the thickness of a spacer of a transistor formed in a logic region, and the thickness of a transistor formed in a peripheral region uniform.

Embodiments also provide a method of reducing the pattern density of a logic region, and increasing the pattern density of a peripheral region.

Embodiments also provide a method of reducing the total perimeter of patterns disposed in a logic region, and increasing the total perimeter of patterns disposed in a peripheral region.

In a semiconductor device according to an embodiment, square-shaped decoupling capacitors may be included in a logic region. Accordingly, the total perimeter of patterns including transistors and the decoupling capacitors in the logic region may be reduced.

In a semiconductor device according to an embodiment, transistor-shaped decoupling capacitors may be included in a logic region. Accordingly, the decoupling capacitors may be formed during formation of logic transistors without an additional process.

In a semiconductor device according to an embodiment, dummy patterns having line, bar, or stick shapes may be included in a peripheral region, accordingly, the density and total perimeter of patterns including transistors in the peripheral region may be increased.

In a semiconductor device according to an embodiment, transistor-shaped dummy patterns may be included in a peripheral region. Accordingly, the dummy patterns may be formed during formation of peripheral transistors without an additional process.

In a semiconductor device according to an embodiment, differences in the density and total perimeter of patterns between a logic region and a peripheral region may be reduced. Accordingly, the size of patterns formed in the same layer in logic regions and peripheral regions can be made uniform.

In a semiconductor device according to an embodiment, a difference in the total perimeter between a logic region and a peripheral region may be reduced, spacers may be uniformly formed.

In a semiconductor device according to an embodiment, spacers may be uniformly formed in a logic region and a peripheral region. Accordingly, high-concentration doping regions may be precisely formed in designed positions.

In a semiconductor device according to an embodiment, high-concentration doping regions may be formed in precise positions in a logic region and a peripheral region. Accordingly, the electrical properties of transistors may be uniform and stable.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:

1. A semiconductor device, comprising:
    a logic region disposed in a central region of the semiconductor device; and
    a peripheral region disposed in an outer region of the semiconductor device,
    the logic region including:
        a line-shaped logic transistor; and
        a box-shaped decoupling capacitor, and
    the peripheral region including:
        a line-shaped peripheral transistor; and
        a line-shaped peripheral dummy transistor disposed adjacent to the peripheral transistor.

2. The semiconductor device as claimed in claim 1, wherein:
    the line-shaped logic transistor has a logic transistor gate electrode having a first width, and
    the box-shaped decoupling capacitor has a capacitor electrode having a second width, the second width being at least ten times greater than the first width.

3. The semiconductor device as claimed in claim 2, wherein the line-shaped peripheral transistor has a peripheral transistor gate electrode having a third width, the third width being at least five times greater than the first width and less than the second width.

4. The semiconductor device as claimed in claim 3, wherein the line-shaped peripheral dummy transistor has a peripheral dummy transistor gate electrode having a fourth width, the fourth width being less than the third width.

5. The semiconductor device as claimed in claim 4, wherein a length of the peripheral dummy transistor gate electrode of the line-shaped peripheral dummy transistor is at least five times greater than the fourth width.

6. The semiconductor device as claimed in claim 2, wherein:
    the logic transistor gate electrode of the line-shaped logic transistor has a first length, and
    the capacitor electrode of the box-shaped decoupling capacitor has a second length less than the first length.

7. The semiconductor device as claimed in claim 2, wherein a length of the capacitor electrode of the box-shaped decoupling capacitor is less than twice the second width thereof.

8. The semiconductor device as claimed in claim 2, wherein the logic region further includes logic dummy transistors disposed parallel to the line-shaped logic transistor and adjacent to the line-shaped logic transistor,
    wherein the logic dummy transistors have a width that is equal to or less than the first width of the line-shaped logic transistor.

9. A semiconductor device, comprising:
    a logic region; and
    a peripheral region,
    the logic region including:
        a plurality of logic transistors parallel to one another, the logic transistors each having a first width in a horizontal direction; and
        a plurality of decoupling capacitors disposed in a row, the decoupling capacitors each having a second width in the horizontal direction, the second width being at least five times greater than the first width, and the peripheral region including:
        a plurality of peripheral transistors parallel to one another, the peripheral transistors each having a third width in the horizontal direction, the third width being greater than the first width and less than the second width; and
        a plurality of peripheral dummy transistors parallel to one another, the peripheral dummy transistors each having a fourth width in the horizontal direction, the fourth width being less than the third width.

10. The semiconductor device as claimed in claim 9, wherein:
    each of the logic transistors includes:
        a logic active region in a substrate;
        a logic transistor gate insulating layer and a logic transistor gate electrode stacked on the logic active region;
        inner logic transistor spacers on side surfaces of the logic transistor gate insulating layer and the logic transistor gate electrode, the inner logic transistor spacers including silicon oxide; and
        outer logic transistor spacers on side surfaces of the inner logic transistor spacers, the outer logic transistor spacers including silicon nitride,
    the inner logic transistor spacers include lower end portions extending onto a top surface of the substrate,
    the outer logic transistor spacers are on the lower end portions of the inner logic transistor spacers, and
    outer side surfaces of the lower end portions of the inner logic transistor spacers are vertically aligned with outer side surfaces of the outer logic transistor spacers.

11. The semiconductor device as claimed in claim 10, wherein:
    each of the decoupling capacitors includes:
        a capacitor active region in the substrate, the capacitor active region being isolated from the logic active region;
        a capacitor dielectric layer and a capacitor electrode on the substrate, the capacitor dielectric layer and the capacitor electrode being configured to overlap the capacitor active region;
        inner capacitor spacers on side surfaces of the capacitor dielectric layer and the capacitor electrode, the inner capacitor spacers including silicon oxide; and
        outer capacitor spacers on side surfaces of the inner capacitor spacers,
    the outer capacitor spacers including silicon nitride,
    the inner capacitor spacers include lower end portions extending onto a top surface of the substrate,
    the outer capacitor spacers are on the lower end portions of the inner capacitor spacers, and
    outer side surfaces of the lower end portions of the inner capacitor spacers are vertically aligned with outer side surfaces of the outer capacitor spacers.

12. The semiconductor device as claimed in claim 11, wherein:

top end portions of the inner capacitor spacers are at a lower level than a top end portion of the capacitor electrode, and top end portions of the outer capacitor spacers are at a lower level than the top end portion of the capacitor electrode.

13. The semiconductor device as claimed in claim 10, wherein:

each of the peripheral transistors includes:

a peripheral active region in the substrate;

a peripheral transistor gate insulating layer and a peripheral transistor gate electrode stacked on the peripheral active region;

inner peripheral transistor spacers on side surfaces of the peripheral transistor gate insulating layer and the peripheral transistor gate electrode, the inner peripheral transistor spacers including silicon oxide; and outer peripheral transistor spacers on side surfaces of the inner peripheral transistor spacers, the outer peripheral transistor spacers including silicon nitride, the inner peripheral transistor spacers have lower end portions extending onto the top surface of the substrate, the outer peripheral transistor spacers are on the lower end portions of the inner peripheral transistor spacers, and outer side surfaces of the lower end portions of the inner peripheral transistor spacers are vertically aligned with outer side surfaces of the outer peripheral transistor spacers.

14. The semiconductor device as claimed in claim 13, wherein:

each of the peripheral dummy transistors includes:

a peripheral dummy active region formed in the substrate and connected to the peripheral active region;

a peripheral dummy transistor gate insulating layer and a peripheral dummy transistor gate electrode stacked on the dummy peripheral active region;

inner peripheral dummy transistor spacers on side surfaces of the peripheral dummy transistor gate insulating layer and the peripheral dummy transistor gate electrode, the inner peripheral dummy transistor spacers having lower end portions extending onto the top surface of the substrate; and outer peripheral dummy transistor spacers on side surfaces of the lower end portions of the inner peripheral dummy transistor spacers, and outer side surfaces of the lower end portions of the inner peripheral dummy transistor spacers are vertically aligned with outer side surfaces of the outer peripheral dummy transistor spacers.

15. The semiconductor device as claimed in claim 14, wherein each of the peripheral dummy transistors further includes:

a low-concentration peripheral dummy transistor doping region vertically aligned with the side surfaces of the peripheral dummy transistor gate electrode, the low-concentration peripheral dummy transistor doping region having a first depth; and a high-concentration peripheral dummy transistor doping region vertically aligned with the outer side surfaces of the outer peripheral dummy transistor spacers, the high-concentration peripheral dummy transistor doping region having a second depth greater than the first depth.

* * * * *